(12) United States Patent
Pantel

(10) Patent No.: US 10,324,492 B2
(45) Date of Patent: Jun. 18, 2019

(54) SMARTPHONE WITH FRONT CAMERA AND MAXIMIZED DISPLAY SCREEN

(71) Applicant: Lothar Pantel, Neckargemuend (DE)

(72) Inventor: Lothar Pantel, Neckargemuend (DE)

(73) Assignee: inodyn NewMedia GmbH, Neckargemuend (DE)

( * ) Notice: Subject to any disclaimer, the term of this patent is extended or adjusted under 35 U.S.C. 154(b) by 0 days.

(21) Appl. No.: 15/856,305

(22) Filed: Dec. 28, 2017

(65) Prior Publication Data

US 2018/0219987 A1    Aug. 2, 2018

Related U.S. Application Data

(63) Continuation of application No. 29/539,390, filed on Sep. 14, 2015, now Pat. No. Des. 810,713.

(30) Foreign Application Priority Data

Jun. 29, 2017   (GB) .................................. 1710466.2

(51) Int. Cl.
*G06F 1/16*       (2006.01)
*H04M 1/02*      (2006.01)
(Continued)

(52) U.S. Cl.
CPC ........ *G06F 1/1605* (2013.01); *G02F 1/13338* (2013.01); *G06F 1/1626* (2013.01);
(Continued)

(58) Field of Classification Search
CPC ...... H04M 1/0264–0266; G06F 1/1605–1686; G06F 3/041–0416;
(Continued)

(56) References Cited

U.S. PATENT DOCUMENTS

D645,833 S      9/2011  Seflic et al.
D665,763 S  *   8/2012  Tsai ........................ D14/138 G
(Continued)

FOREIGN PATENT DOCUMENTS

EM  004013787-0001 S    7/2017
EM  004494417-0001 S   11/2017

OTHER PUBLICATIONS

Samsung Galaxy S IV Design Places the Front Camera at the Bottom, Mar. 7, 2013, available at https://www.concept-phones.com/samsung/samsung-galaxy-iv-design-places-front-camera-bottom/ (Year: 2013).*

(Continued)

*Primary Examiner* — Gennadiy Tsvey

(57) ABSTRACT

A smartphone device may have thin borders at the left, right, top, and/or bottom edges of the display screen. To accommodate, e.g., a front camera in spite of a border that is too thin for a camera module and lens, at least one corner of the display may be cut out. Optical sensor(s), emitter(s), or the lens of a front camera may be disposed at the location(s) of the cutout(s). A wide-screen movie may be displayed in letterbox mode with horizontal bars above and/or below the movie, wherein the cutout(s) are located, at least partially, in the region(s) of the horizontal bars, thereby avoiding that larger parts of the movie are hidden by the cutout(s). In other embodiments, an uninterrupted status bar may be displayed between a cutout in the upper-left corner and a cutout in the upper-right corner of the display.

20 Claims, 16 Drawing Sheets

(51) Int. Cl.
*G09G 3/20* (2006.01)
*G02F 1/1333* (2006.01)
*G06F 3/041* (2006.01)
*H01L 27/32* (2006.01)

(52) U.S. Cl.
CPC .......... *G06F 1/1637* (2013.01); *G06F 1/1686* (2013.01); *G06F 3/041* (2013.01); *G06F 3/0416* (2013.01); *G09G 3/2092* (2013.01); *H01L 27/323* (2013.01); *H04M 1/0264* (2013.01); *H04M 1/0266* (2013.01); *G09G 2340/04* (2013.01); *G09G 2340/145* (2013.01); *G09G 2354/00* (2013.01); *H04M 2250/12* (2013.01)

(58) Field of Classification Search
CPC ... G02F 1/13338; G02F 3/041; G09G 3/2092; G09G 2340/04–2354/00; H01L 27/323
See application file for complete search history.

(56) References Cited

U.S. PATENT DOCUMENTS

| | | | |
|---|---|---|---|
| D693,787 S | 11/2013 | Reivo et al. | |
| D695,250 S * | 12/2013 | Kim | D14/138 G |
| D717,263 S | 11/2014 | Wozniak | |
| 8,996,082 B2 | 3/2015 | Tam | |
| D730,863 S | 6/2015 | Yamagishi et al. | |
| D734,326 S | 7/2015 | McManigal | |
| D747,713 S | 1/2016 | Choi et al. | |
| D749,551 S | 2/2016 | Mitchell | |
| D752,040 S | 3/2016 | Cebe et al. | |
| D762,628 S * | 8/2016 | Yoon | D14/248 |
| 9,405,391 B1 | 8/2016 | Mackraz | |
| D767,563 S | 9/2016 | Satzger et al. | |
| D772,835 S | 11/2016 | Kim et al. | |
| D776,108 S | 1/2017 | Hsu | |
| D777,700 S * | 1/2017 | Kwon | H04N 5/2258 D14/138 G |
| 9,560,254 B2 * | 1/2017 | Lombardi | H04N 5/2258 |
| D780,147 S | 2/2017 | Song | |
| D780,710 S | 3/2017 | Song | |
| D783,565 S * | 4/2017 | Kim | D14/138 G |
| D783,566 S * | 4/2017 | Kim | D14/138 G |
| D784,281 S * | 4/2017 | Ryu | D14/138 G |
| D784,314 S * | 4/2017 | Ryu | D14/248 |
| D786,214 S * | 5/2017 | Kwon | D14/138 G |
| D788,731 S * | 6/2017 | Park | D14/138 C |
| D794,004 S * | 8/2017 | Kwon | D14/248 |
| D794,623 S * | 8/2017 | Kwon | D14/248 |
| D798,263 S * | 9/2017 | Kwon | D14/138 G |
| 2002/0147033 A1 * | 10/2002 | Ban | H04N 7/142 455/566 |
| 2006/0284850 A1 | 12/2006 | Tokkonen | |
| 2008/0309637 A1 * | 12/2008 | Lim | G06F 1/1624 345/173 |
| 2009/0060452 A1 * | 3/2009 | Chaudhri | H04N 5/445 386/239 |
| 2012/0032979 A1 | 2/2012 | Blow et al. | |
| 2012/0105400 A1 * | 5/2012 | Mathew | H04N 5/2251 345/207 |
| 2013/0321740 A1 * | 12/2013 | An | H05K 5/0217 349/58 |
| 2014/0135071 A1 | 5/2014 | Lee et al. | |
| 2015/0077629 A1 | 3/2015 | Jeong | |
| 2015/0089675 A1 * | 3/2015 | Gulick, Jr. | G06F 1/1632 726/35 |
| 2015/0229849 A1 * | 8/2015 | Shin | H04N 1/00307 348/207.1 |
| 2015/0271392 A1 | 9/2015 | Musgrave et al. | |
| 2015/0287164 A1 * | 10/2015 | Kominar | G06T 3/0093 345/647 |
| 2015/0347732 A1 * | 12/2015 | Alameh | G06F 21/32 726/19 |
| 2016/0132464 A1 | 5/2016 | Imana | |
| 2016/0132470 A1 | 5/2016 | Imana | |
| 2016/0240173 A1 | 8/2016 | Bostick et al. | |
| 2016/0313593 A1 | 10/2016 | Grip | |
| 2017/0004798 A1 * | 1/2017 | Park | G09G 3/3648 |
| 2017/0123452 A1 | 5/2017 | Evans et al. | |
| 2017/0123453 A1 | 5/2017 | Evans et al. | |
| 2017/0123454 A1 | 5/2017 | Evans et al. | |
| 2017/0123575 A1 | 5/2017 | Evans et al. | |
| 2017/0124933 A1 | 5/2017 | Evans et al. | |
| 2017/0126937 A1 | 5/2017 | Evans et al. | |
| 2017/0126979 A1 | 5/2017 | Evans et al. | |
| 2017/0162111 A1 | 6/2017 | Kang et al. | |
| 2017/0168463 A1 | 6/2017 | Hong et al. | |
| 2018/0121724 A1 * | 5/2018 | Ovsiannikov | G06K 9/00617 |

OTHER PUBLICATIONS

Early publication of UK patent application—published by the inventor/applicant of the present application. Twelve-Month Grace Period Applies; Inventor/author: Lothar Pantel; Title: "Front-facing camera and maximized display screen of a mobile device;" Publication Date: Jul. 3, 2017; Available online from: http://www.earlypublication.com.

Alex Hern, May 30, 2017, "Android co-founder reveals new smartphone to take on Apple and Samsung," The Guardian, Available online from: https://www.theguardian.com/technology/2017/may/30/essential-phone-android-co-founder-reveals-new-smartphone-apple-samsung.

Samuel Gibbs, Nov. 10, 2017, "iPhone X review: Apple finally knocks it out of the park," The Guardian, Available online from: https://www.theguardian.com/technology/2017/nov/10/iphone-x-review-apple-face-id-all-screen-design-home-button.

* cited by examiner

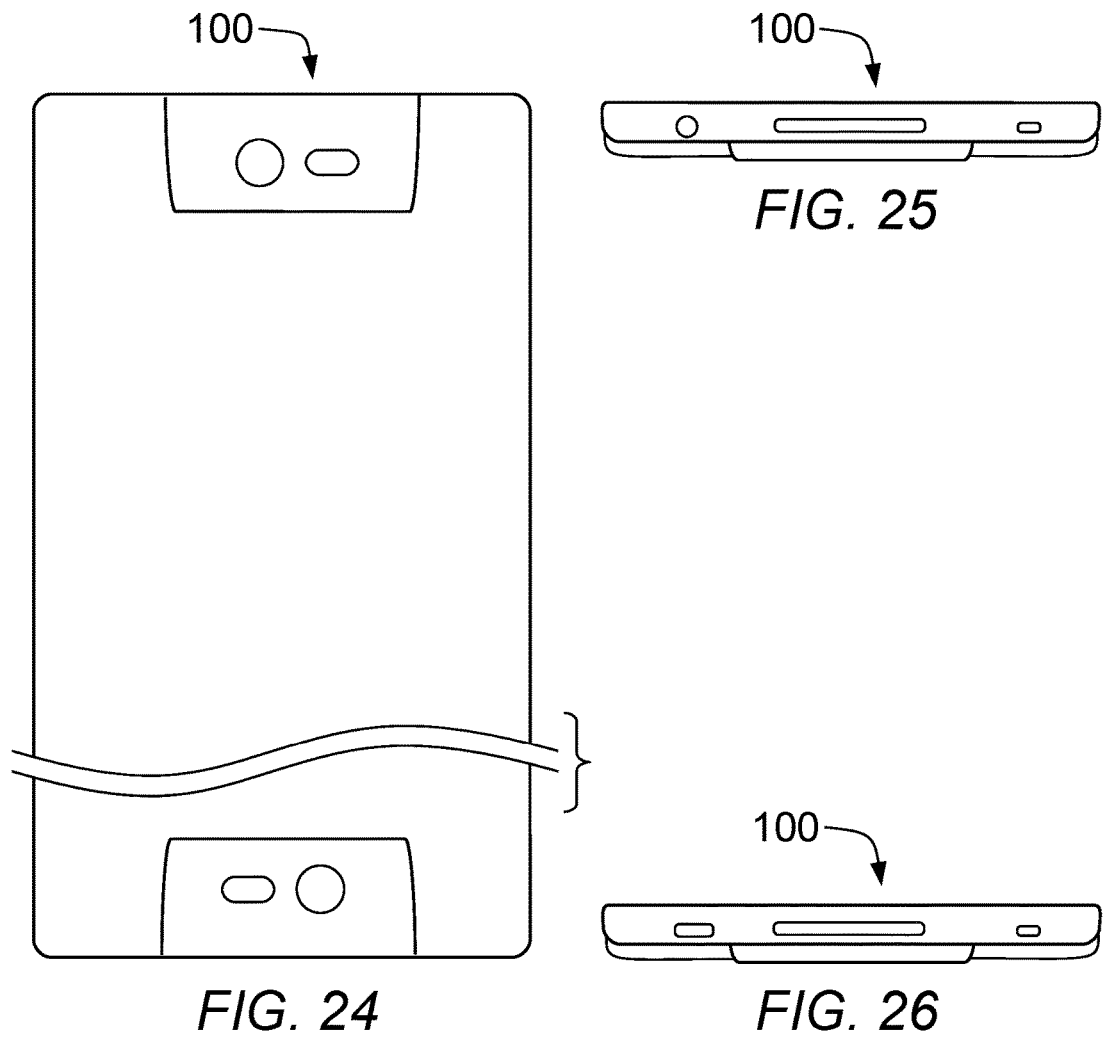
FIG. 24
FIG. 25
FIG. 26
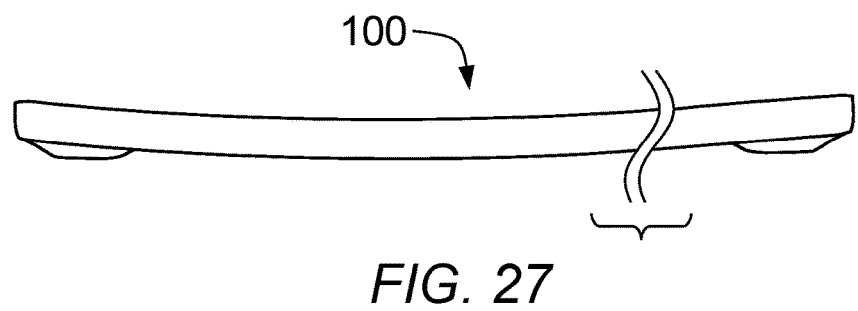
FIG. 27

SMARTPHONE WITH FRONT CAMERA AND MAXIMIZED DISPLAY SCREEN

CROSS-REFERENCE TO RELATED APPLICATIONS

This application is a continuation-in-part of U.S. application Ser. No. 29/539,390, filed Sep. 14, 2015, now U.S. Pat. No. D810,713 S. The benefit of the above prior application is claimed and the entire disclosure of the prior application, including the unabridged description, as originally filed on Sep. 14, 2015, is expressly incorporated herein by reference. This application claims priority from United Kingdom Patent Application No. 1710466.2, filed Jun. 29, 2017.

TECHNICAL FIELD

The present invention relates to smartphones and, in particular, to methods and systems that maximize the display screen of a smartphone while providing a high-quality, front-facing camera.

BACKGROUND OF THE INVENTION

Common smartphones, phablets, or comparable mobile electronic devices contain a front-facing camera placed on the front side of the mobile electronic devices. The front side of the mobile electronic devices also contains a display screen, using a display technology such as liquid-crystal display (LCD) or active-matrix organic light-emitting diode (AMOLED).

For example, the display may use an LC panel. The LC panel may include a thin film transistor (TFT) substrate, a color filter substrate, and LC molecules injected between the TFT substrate and the color filter substrate. The TFT substrate may include gate lines and data lines implemented as matrices. Thin film transistors (TFT) may be formed at crossing points of the gate lines and the data lines. A signal voltage is applied to a common electrode disposed between a pixel electrode and the color filter substrate. Liquid crystal molecules are aligned between the pixel electrode and the common electrode according to the signal voltage, thereby controlling light transmittance. The color filter substrate may include a color filter and a common electrode, the color filter having red, green, and blue filters repeatedly formed in a state where black matrices are disposed therebetween. The common electrode may be formed of a transparent conductive material, such as indium tin oxide (ITO) or indium zinc oxide (IZO).

A pair of polarizers may be arranged on the upper and lower surfaces of the LC panel. The polarizers may be arranged to cross each other. The polarizer disposed under the LC panel serves to polarize light incident onto the LC panel, and the polarizer formed on the LC panel serves as an analyzer. A backlight unit may be disposed beneath the LC panel. The backlight unit may include a diffusion sheet, a reflection sheet, and a prism sheet.

In another example, the display panel may be implemented as an AMOLED display consisting of several layers, e.g., cathode layer, organic active layers, thin-film transistor (TFT) array, and substrate. An active matrix of OLED pixels generates light (luminescence) upon electrical activation. The active matrix of OLED pixels may be deposited or integrated onto the thin-film transistor (TFT) array, which functions as a series of switches to control the current flowing to each individual pixel. Known TFT backplane technologies, such as polycrystalline silicon (poly-Si) and amorphous silicon (a-Si), may be used. The display panel may be a flexible display, which enables the display panel to be bent, rolled, or curved at the edges. For example, a flexible OLED-based display may comprise a flexible substrate on which the electroluminescent organic semiconductor is deposited. Optionally, the display panel may have an in-cell touch panel that integrates a capacitive sensor array.

The display screen may be rectangular with an aspect ratio of, for instance, 16:9, 2:1, 19.5:9, or 21:9. Furthermore, display panels with a round shape are known from the prior art. More information about the assembly and structure of round displays (e.g., for smartwatches) can be found, inter alia, in patent application US2017/0168463 A1, titled "Display panel with minimum borders" and patent application US2016/0313593 A1, titled "Divided backlight configuration of a display."

A smartphone with a rectangular display screen may be oriented horizontally or vertically by the user, which may result in operating modes known as "landscape mode" and "portrait mode," respectively. The page orientation can also be described with the terms "landscape orientation" and "portrait orientation."

A user may hold the smartphone horizontally (landscape mode) and may watch a video or movie displayed in full screen mode on the display screen. A feature film or a wide-screen movie may have an aspect ratio of, e.g., 2.35:1, 2.39:1, 2.40:1, or 2.66:1. If the wide-screen movie has an aspect ratio that is wider, i.e., greater, than the aspect ratio of the display screen, the wide-screen movie frames may be displayed on the display screen in a mode known as "letterbox": horizontal bars, typically black bars, are inserted above and below the wide-screen movie.

The display screen of a smartphone typically does not occupy the full front side of the smartphone because a wide border is required at the top and/or at the bottom of the front side to accommodate the lens of a front-facing camera and also to accommodate other optical or acoustic sensors and emitters. As a result, the size of the display screen is reduced.

The front-facing camera of a smartphone may be used for video telephony or to take a self-portrait photograph, commonly known as a "selfie." In recent years, the resolution of the front-facing camera has increased, and it is likely that the resolution will continue to increase in the future (e.g., from 8 megapixels to 13 megapixels) to enable the user to take "selfies" of the highest quality and to record high-quality 4K videos. Therefore, high-quality camera lenses for the front-facing camera and an undisturbed light path are essential.

Patent applications US2017/0123454 A1, US2017/0123453 A1, and US2017/0123452 A1, titled "Camera integrated into a display," patent application US2017/0123575 A1, titled "Optical sensors disposed beneath the display of an electronic device," patent application US2017/0124933 A1, titled "Mobile device with display overlaid with at least a light sensor," patent applications US2017/0126979 A1 and US2017/0126937 A1, titled "Apparatus and method to maximize the display area of a mobile device," and patent application US2015/0271392 A1, titled "System and method for coordinating image capture in a camera hidden behind a display device," suggest disposing the front-facing camera beneath the display screen of the smartphone. However, depending on the display technology of the screen (e.g., LCD, OLED, Micro-LED, etc.), small opaque or semi-transparent structures that may be necessary for the operation of the display screen may blur or cloud the resulting picture of the front-facing camera, because the light path must pass through the display screen. Furthermore, LCD panels often also require removing a diffuser layer to adapt them for use as transparent displays, and the polarizing filters of the LCD panels inherently limit the transmission efficiency of unpolarized light. This may reduce the light sensitivity of a front-facing camera located beneath the display screen, especially in low-light conditions.

SUMMARY OF THE INVENTION

Aspects of the present disclosure are directed to mobile electronic devices with a display screen and at least one front-facing camera, optical sensor, and/or emitter, such as smartphones or phablets. In embodiments of the present invention, a smartphone may have very thin borders at the top, bottom, left, and/or right edges of the display screen. To accommodate an optical sensor, such as a front camera, in spite of a border that is too thin for the optical sensor (e.g., camera module and lens), at least one corner of the display panel may be cut out such that a recess is created. An optical sensor and/or emitter or the lens of a front camera may be disposed at the location of the recess or cutout. Optionally, in some embodiments, the recess or cutout may have a convex shape for the most part, thereby maximizing the remaining screen area.

Depending on the embodiment, a wide-screen movie may be displayed on the display screen in letterbox mode (landscape orientation using the full width of the display screen) such that the (e.g., black) bars above and below the wide-screen movie are at least partially located in the region of the cutout(s), thereby reducing or preventing the problem that parts of the movie are invisible (i.e., hidden) due to the cutout(s). For example, a smartphone (with a front camera or a front-facing optical sensor) may be made for maximizing the size of a wide-screen movie in relation to the outer dimensions of said smartphone, and may comprise:
  a) an oblong display, said display being aligned in landscape orientation and having a horizontal screen width, at least an upper corner, and at least a lower corner, wherein said display has an upper cutout at said upper corner and a lower cutout at said lower corner, said upper cutout having an upper cutout area, and said lower cutout having a lower cutout area,
  b) a computer system configured to be at least able to alternately display a first screen content and a second screen content on said display,
  c) said first screen content comprising:
    i) a wide-screen movie in landscape orientation that seamlessly extends over the entire horizontal screen width of said display, said wide-screen movie having a left side, a right side, and an image width, wherein said wide-screen movie is displayed horizontally between said upper cutout and said lower cutout,
    ii) an upper horizontal matte region located above said wide-screen movie, wherein said upper horizontal matte region extends into said upper cutout area, such that said upper cutout is accommodated, at least in part, in said upper horizontal matte region,
    iii) a lower horizontal matte region located below said wide-screen movie, wherein said lower horizontal matte region extends into said lower cutout area, such that said lower cutout is accommodated, at least in part, in said lower horizontal matte region,
  d) at least one front camera module with at least one lens disposed, at least in part, in said upper cutout area or said lower cutout area, and at least one optical emitter disposed, at least in part, in said lower cutout area or said upper cutout area,
  e) an oblong casing with at least a first thin border and a second thin border, said casing being aligned in landscape orientation and having an outer horizontal measurement, wherein said first thin border is disposed adjacent to the left side of said wide-screen movie and said second thin border is disposed adjacent to the right side of said wide-screen movie, such that the outer horizontal measurement of said casing is nearly equal to the image width of said wide-screen movie,
  f) said second screen content comprising:
    i) an image having a visible area, and
    ii) a schematized camera lens symbol located adjacent to said upper cutout area or said lower cutout area, wherein said schematized camera lens symbol surrounds said upper cutout area or said lower cutout area substantially in a quarter circle, such that the visible area of said image is maximized, said schematized camera lens symbol being visible, at least if said front camera module is active.

The aforementioned and many further aspects, variants, objectives, and advantages of the invention will be comprehensible to those skilled in the art after reading detailed descriptions of the embodiments.

BRIEF DESCRIPTION OF THE DRAWINGS

Further features, advantages, and potential applications will be apparent from the drawings. All described and/or illustrated features, alone or in any combination, independent of the synopsis in individual claims, constitute the subject matter of the invention.

A lens is located at least in one corner. The display screen shows a status bar that has approximately the height of the recess surrounding the lens of the front camera module, optical sensor, and/or optical emitter. Furthermore, the display screen shows schematized app icons of a start screen. The bottom view, rear view, front view, and left/right side views of the embodiment correspond to FIG. 7, FIG. 8, FIG. 9, and FIG. 10, respectively.

Figure 12:
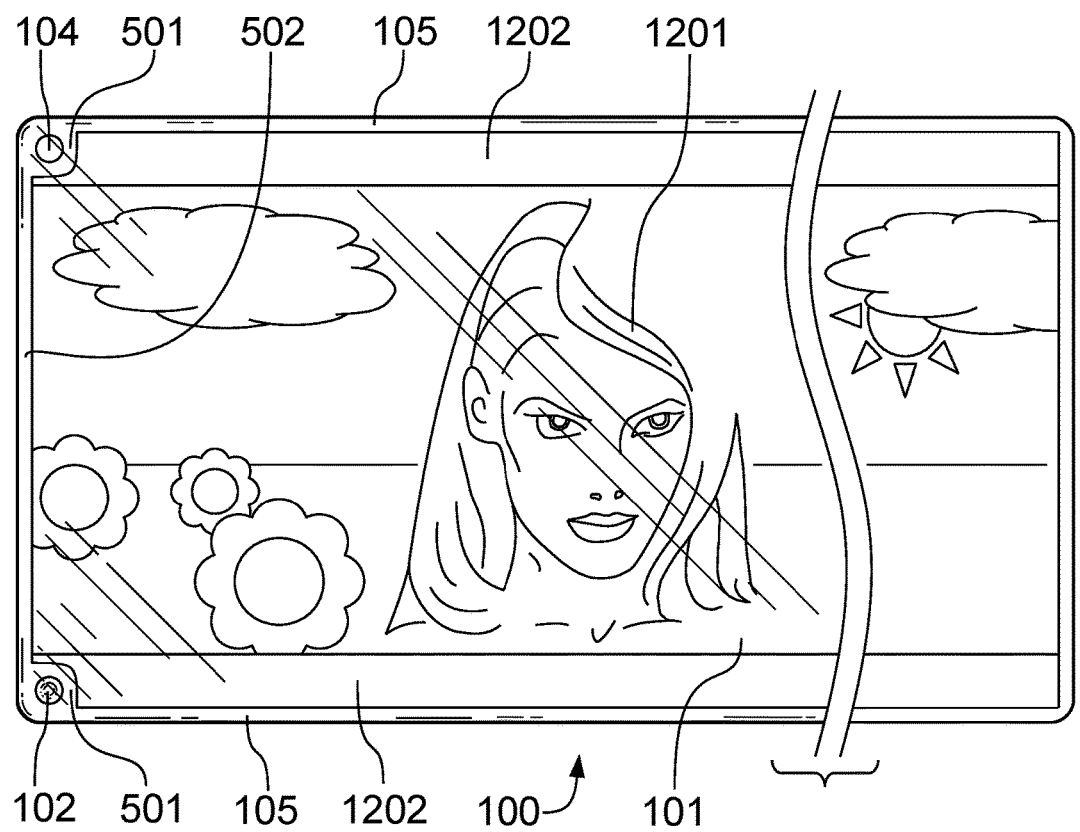

FIG. 12 is a top plan view of an embodiment of the mobile electronic device in accordance with the present invention. A lens is located at least in one corner. The display screen shows a letterboxed wide-screen movie frame (e.g., black bars above and below the movie). The bottom view, rear view, front view, and left/right side views of the embodiment correspond to FIG. 7, FIG. 8, FIG. 9, and FIG. 10, respectively.

Figure 13:
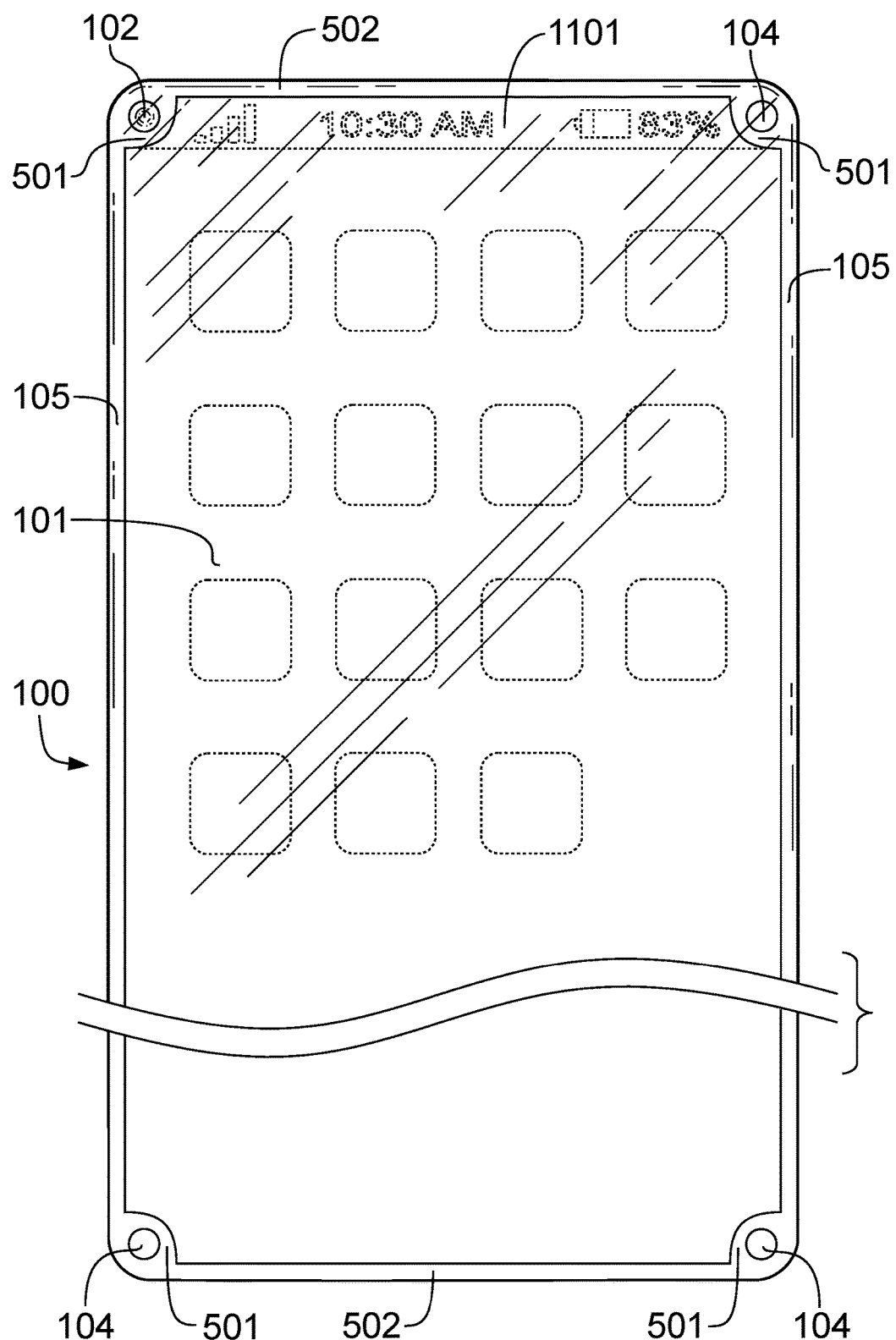

FIG. 13 is a top plan view of an embodiment of the mobile electronic device in accordance with the present invention. The general description of FIG. 11 applies.

Figure 14:
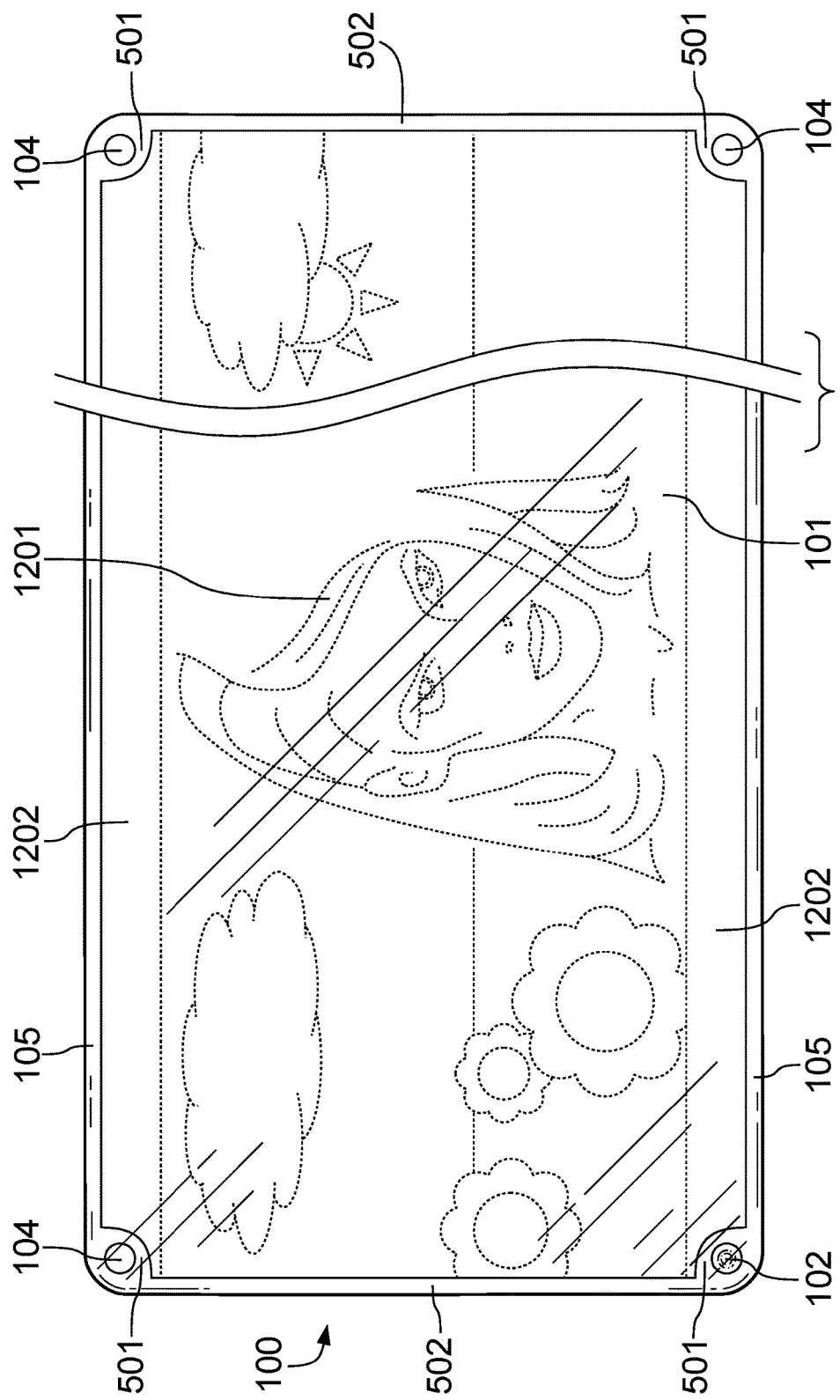

FIG. 14 is a top plan view of an embodiment of the mobile electronic device in accordance with the present invention. The general description of FIG. 12 applies.

Figure 15:
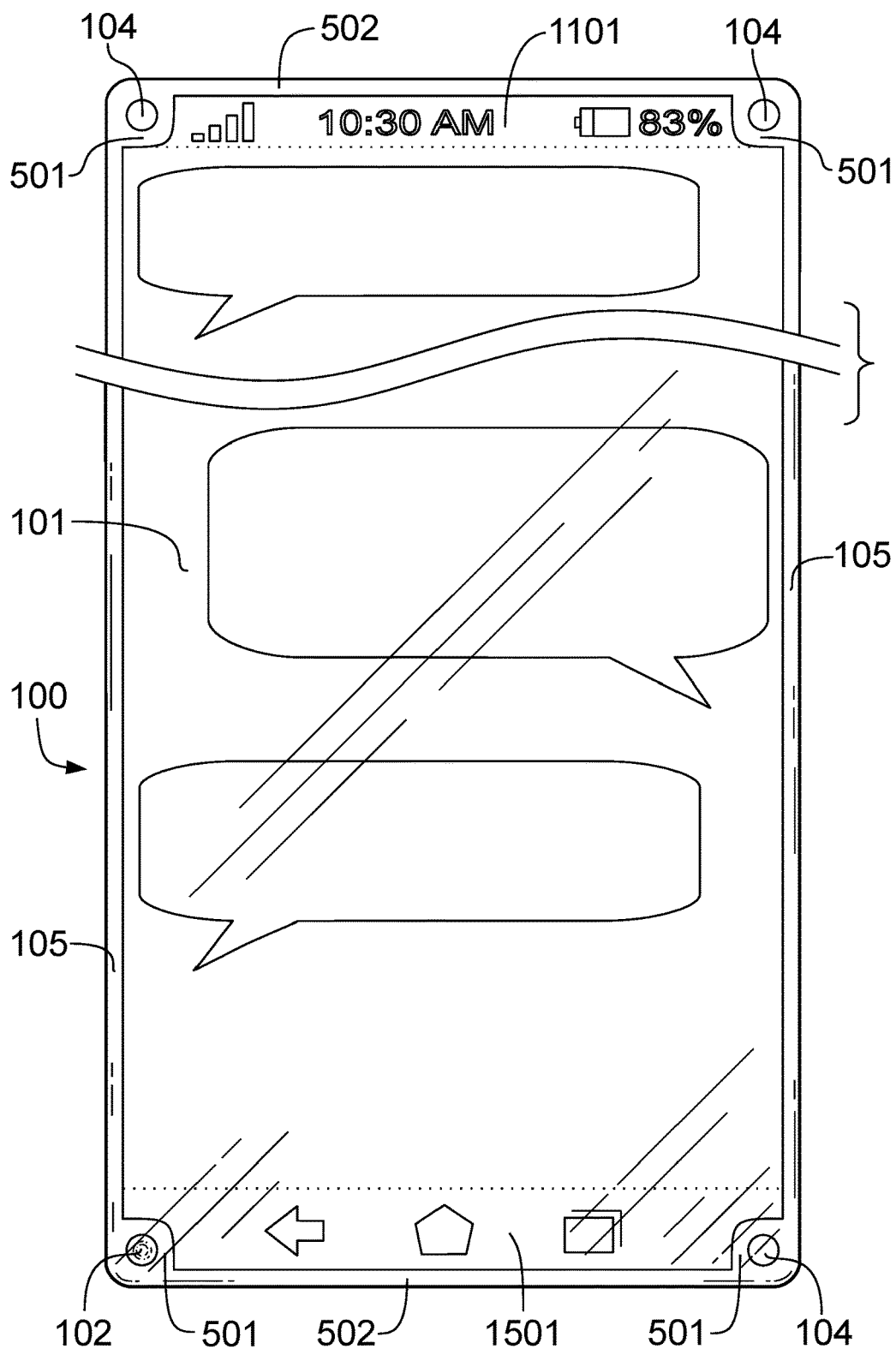

FIG. 15 is a top plan view of an embodiment of the mobile electronic device in accordance with the present invention. A lens is located at least in one corner. The display screen shows a status bar at the top, onscreen soft keys for the navigation at the bottom, and the chat dialog of a communication app. The bottom view, rear view, front view, and left/right side views of the embodiment correspond to FIG. 7, FIG. 8, FIG. 9, and FIG. 10, respectively.

Figure 16:
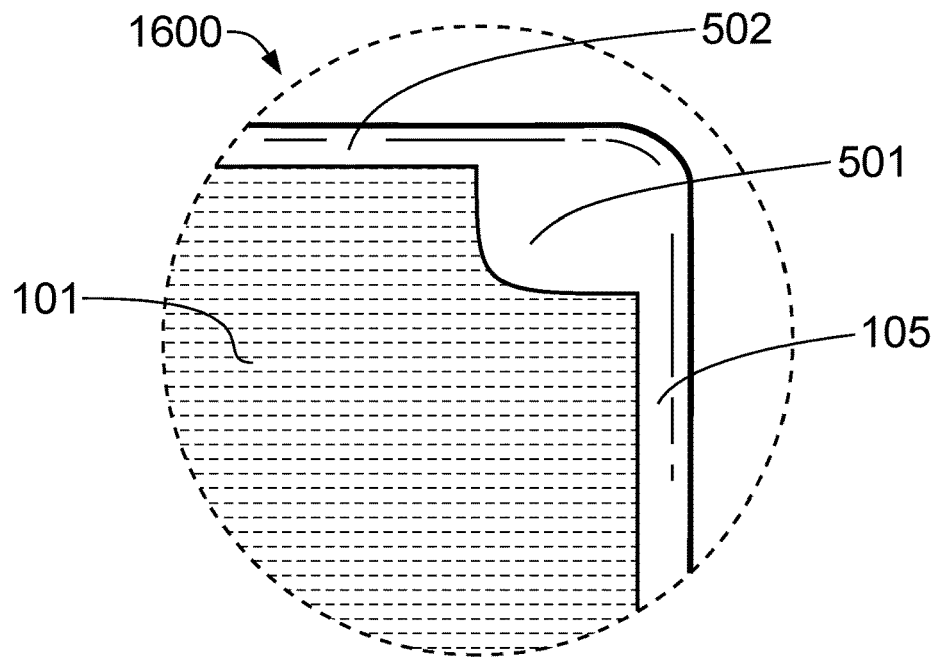

FIG. 16 is an enlarged view showing an exemplary shape of the upper right-hand corner.

Figure 17:
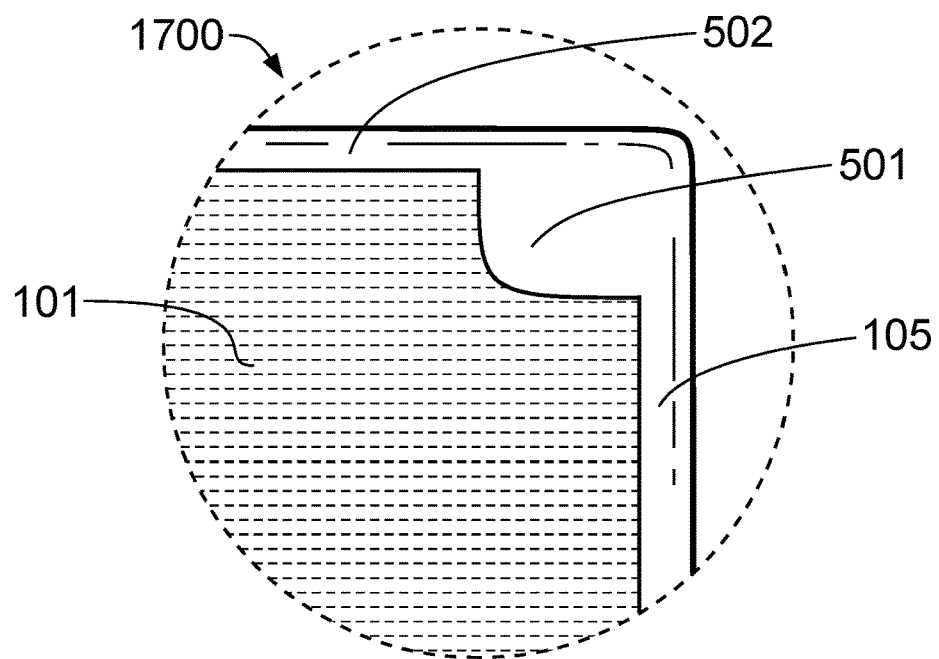

FIG. 17 is an enlarged view showing another exemplary shape of the upper right-hand corner.

Figure 18:
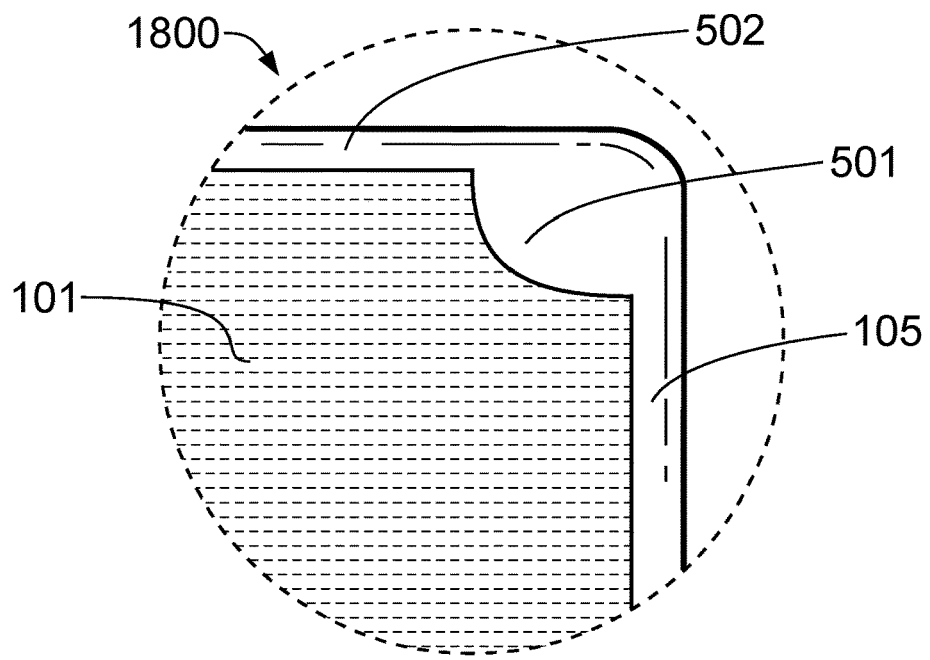

FIG. 18 is an enlarged view showing yet another exemplary shape of the upper right-hand corner.

Figure 19:
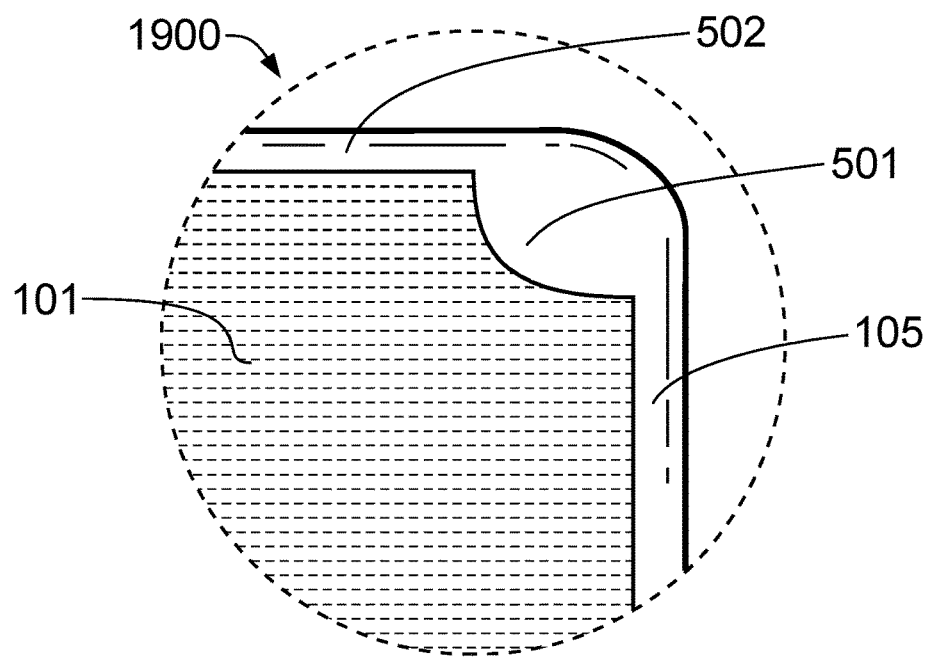

FIG. 19 is an enlarged view showing yet another exemplary shape of the upper right-hand corner.

Figure 20:
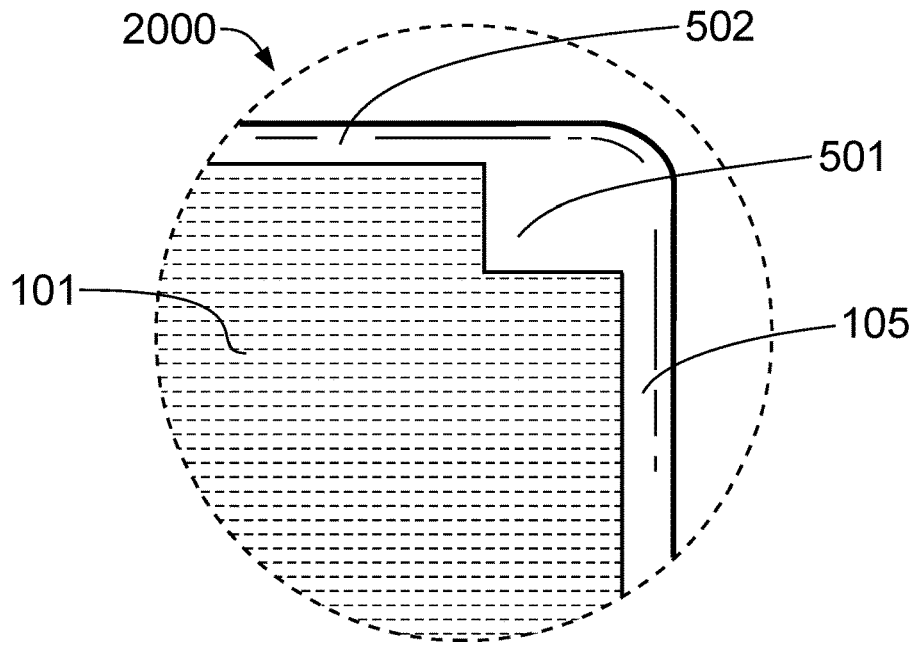

FIG. 20 is an enlarged view showing yet another exemplary shape of the upper right-hand corner.

Figure 21:
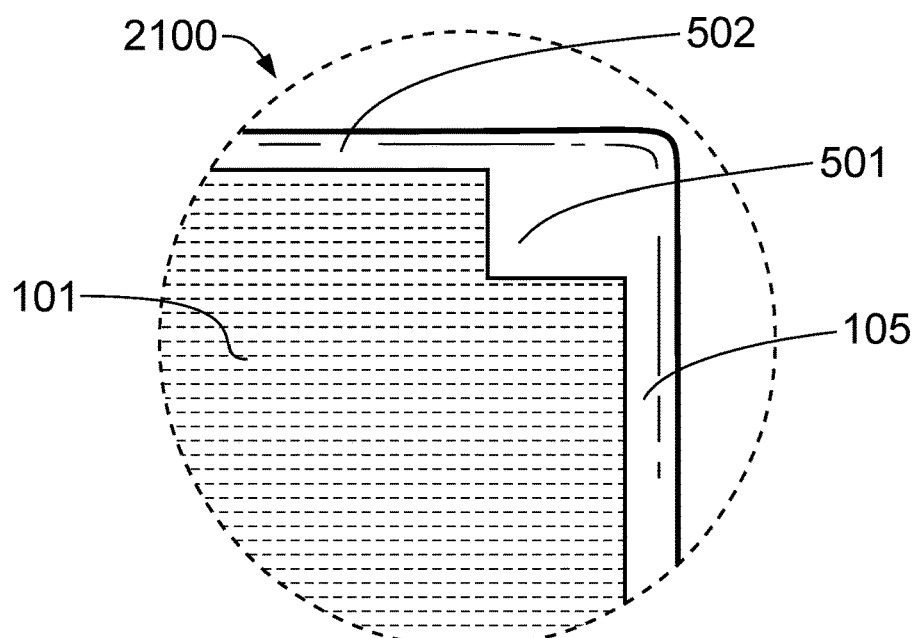

FIG. 21 is an enlarged view showing yet another exemplary shape of the upper right-hand corner.

Figure 22:
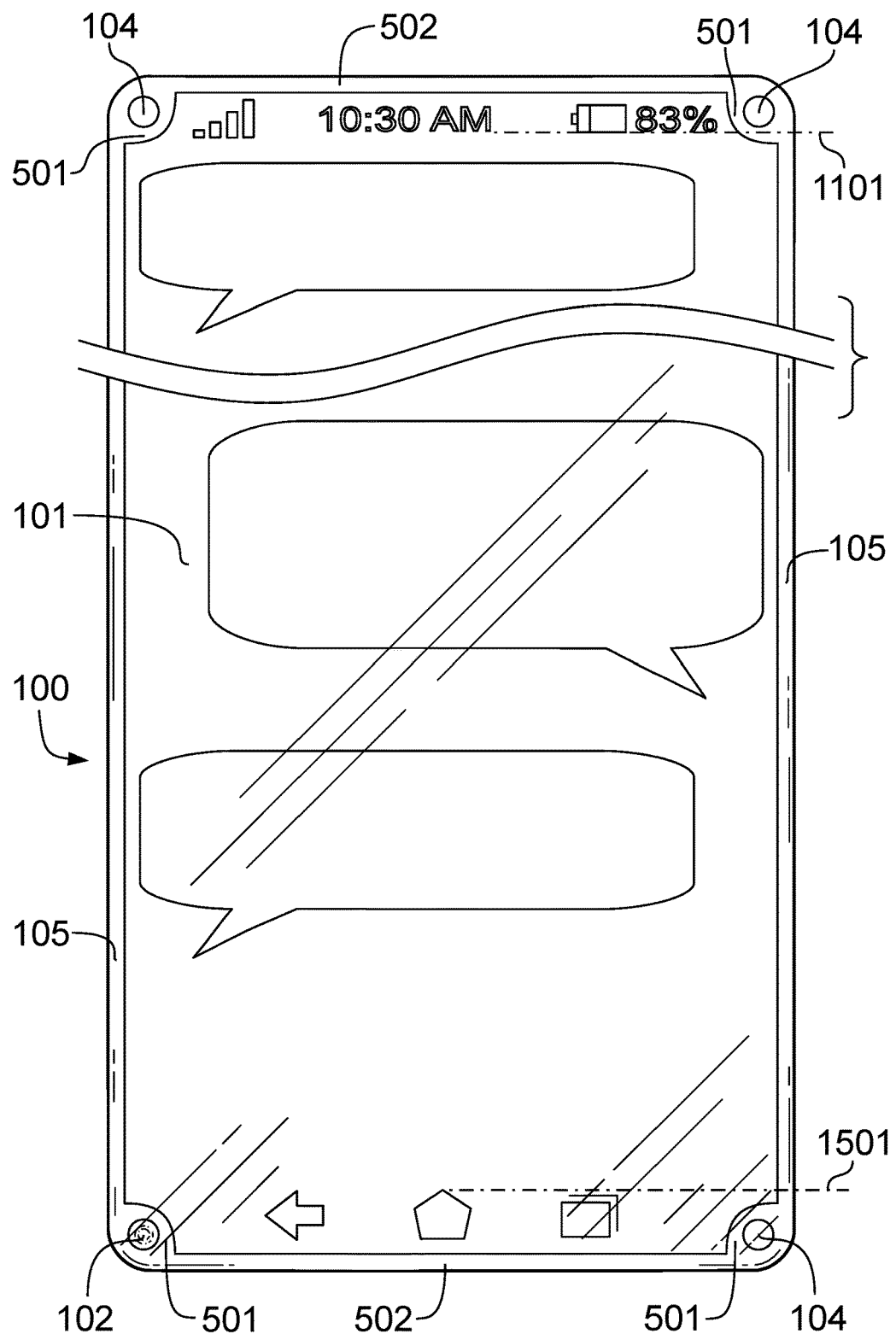

FIG. 22 illustrates further details of exemplary embodiments.

Figure 23:
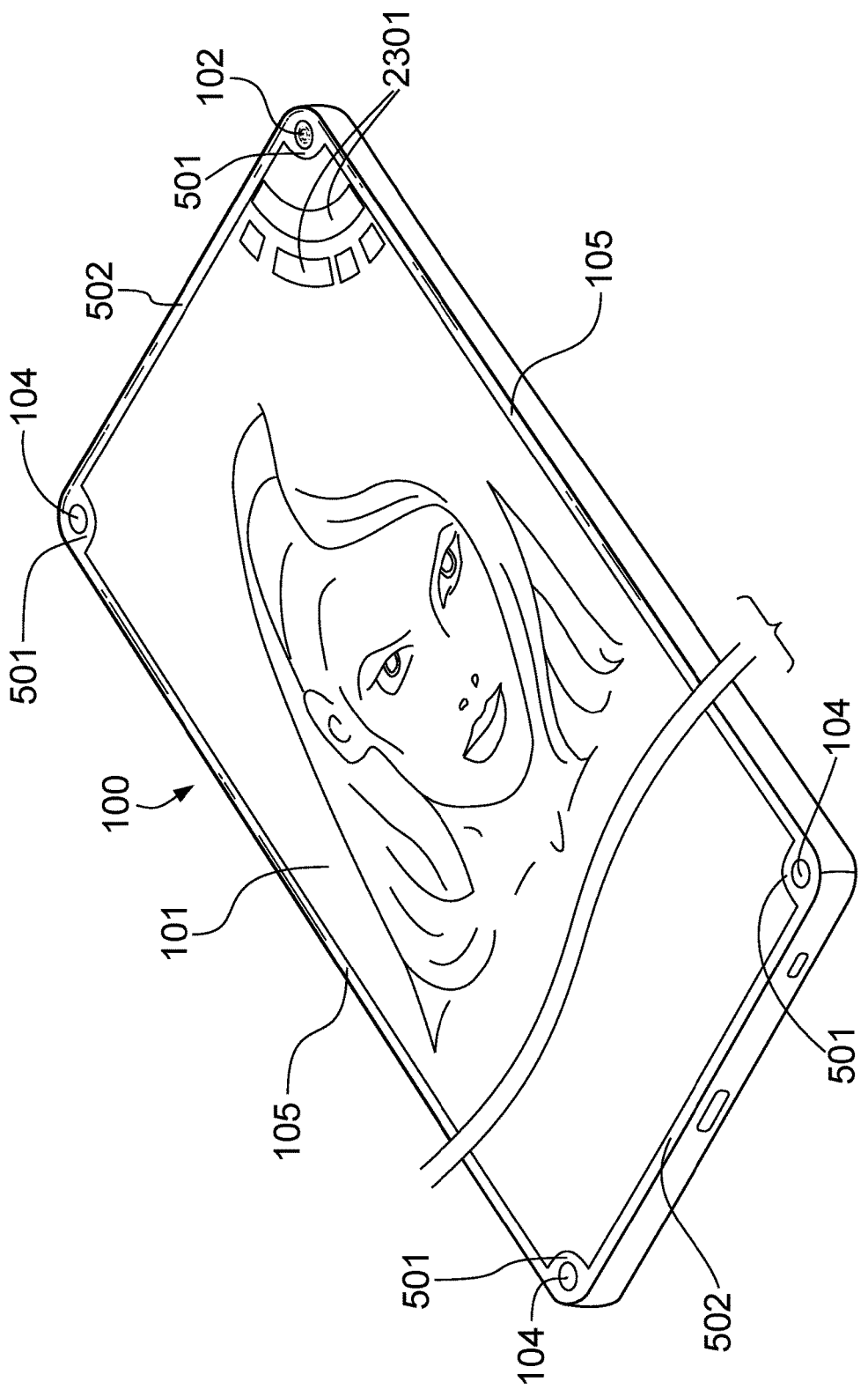

FIG. 23 is a top/front perspective view of an embodiment of the mobile electronic device in accordance with the present invention. The lens of a front camera module is located at least in the upper right-hand corner. The display screen shows the self-portrait of a woman that may have been taken by the front camera. Furthermore, the display screen shows a schematized camera lens symbol, which may be animated and which may indicate an active front camera.

FIG. 24 is a bottom view of an embodiment wherein the rear side of the smartphone is characterized by a fully symmetrical arrangement.

FIG. 25 is a rear view thereof.

FIG. 26 is a front view thereof.

Figure 10:
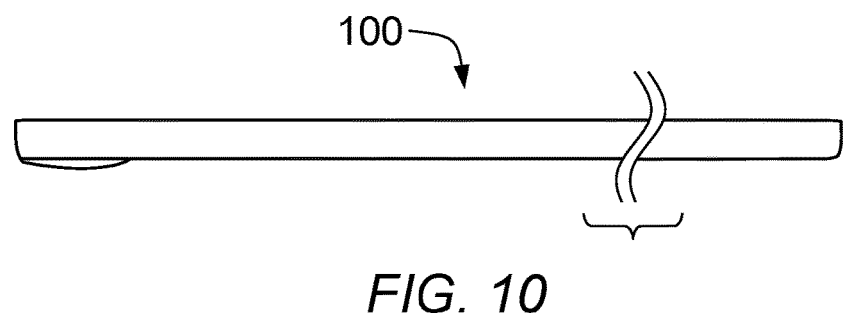
FIG. 10 is a left side view thereof, the right side being a mirror image thereof.

FIG. 27 shows a left side view of an embodiment with a slightly curved display screen (instead of a flat display screen, as shown in FIG. 10).

DETAILED DESCRIPTION OF THE INVENTION

Figure 1:
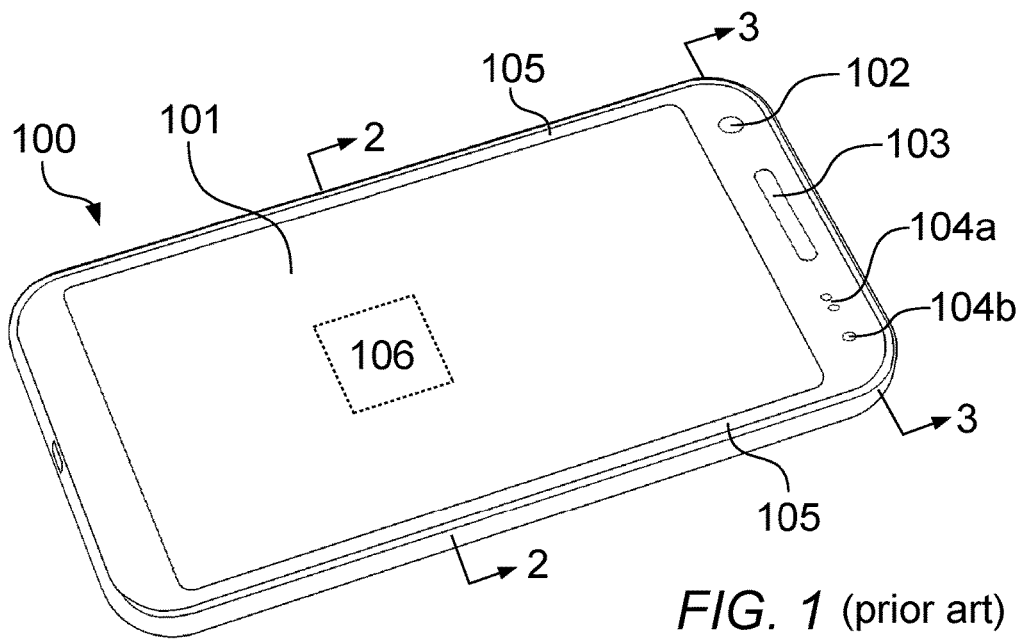
FIG. 1 shows a conventional smartphone (prior art).

FIG. 1 (labeled "prior art") shows a conventional smartphone 100 as an example of a mobile electronic device. The drawing illustrates a display screen 101 with touchscreen functionality, the lens 102 of a front-facing camera, an earpiece 103 (ear speaker for telephone calls), and optical sensors and/or emitters 104. An optical sensor 104a may be, for instance, a combined proximity and light sensor and an optical emitter 104b may be, for instance, a flash LED or an infrared (IR) LED to illuminate the face of the user. Alternatively, the optical emitter 104b may be a status LED that indicates operating states, such as "on/off" or "charging battery." A graphics sub-system 106 (integrated into the smartphone 100 and shown in dotted lines in FIG. 1) is responsible for generating the screen content displayed on the display screen 101.

As can be seen in FIG. 1, conventional smartphones 100 typically feature a thin border 105 at the left and right edge of the display screen 101. It can also be seen that in the example of FIG. 1, a wide border is required at least at the top of the front side of the smartphone 100 to accommodate the lens 102 (front camera), the earpiece 103 (for the ear speaker), the optical sensor 104a (e.g., proximity sensor or light sensor), and the optical emitter 104b (e.g., LED indicator or IR-LED).

Figure 2:
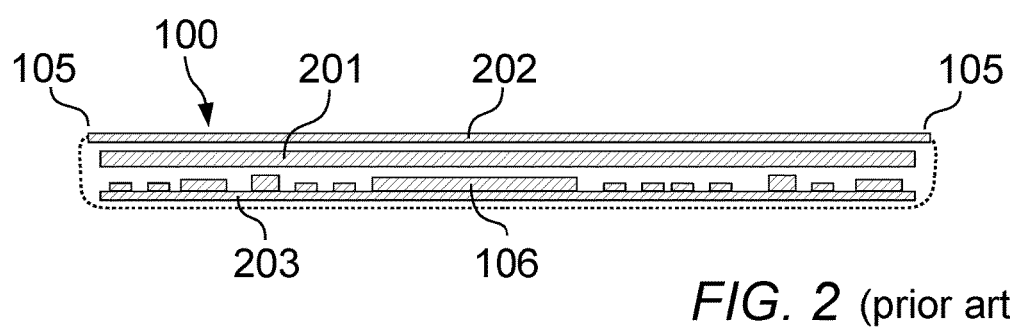
FIG. 2 shows a sectional view of the smartphone of FIG. 1 (prior art).
Figure 3:
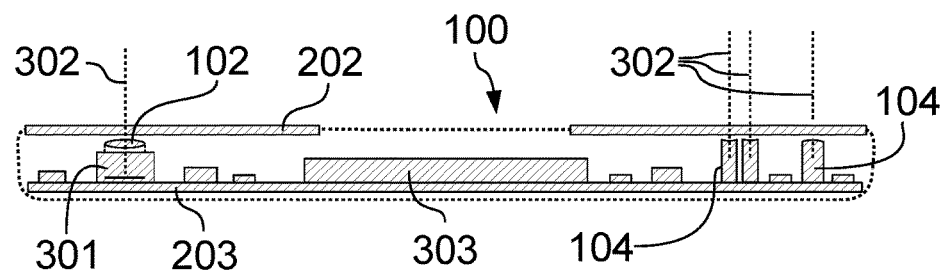
FIG. 3 shows another sectional view of the smartphone of FIG. 1 (prior art).

FIG. 2 and FIG. 3 (both labeled "prior art") show sectional views of the smartphone 100 taken at the sectioning plane and in the direction indicated by section lines 2-2 and section lines 3-3 (in FIG. 1). A smartphone 100, as known from the prior art, may comprise several layers: The front side of the smartphone's casing 100 may consist of a cover glass 202. A rectangular display panel 201 may be disposed beneath the cover glass 202, and a printed circuit board 203 (PCB) equipped with ICs may be disposed beneath the display panel 201. Optionally, a transparent touchscreen panel (e.g., capacitive touchscreen) may be disposed between the cover glass 202 and the display panel 201, or the layer that detects touch may be integrated into the display panel 201, rather than overlaid on top of it.

The display panel 201 (shown in FIG. 2) forms images by receiving electric signals, e.g., from the graphics sub-system 106. The images generated by the display panel 201 are visible on the display screen 101. The display panel 201 can be of any applicable known or convenient type, including, but not limited to, liquid-crystal displays, micro-LED displays, and organic light-emitting devices.

As illustrated in FIG. 2 and FIG. 3, the printed circuit board 203 may be equipped, inter alia, with the graphics sub-system 106 (e.g., a GPU), an ear speaker 303, a front camera module 301 (including the lens 102), and optical sensors and emitters 104 (e.g., proximity sensor, light sensor, LED indicator, or IR-LED). Dotted lines illustrate the light path 302 of the front-facing camera 301, 102 and the light path 302 of the optical sensors and emitters 104.

In FIG. 2 and FIG. 3, the remaining casing of the smartphone 100 (e.g., lower part, bottom side) is indicated as a dotted line. More information about the assembly of a smartphone 100 may be found in patent application US2014/0135071 A1, titled "Mobile terminal." More information about a camera module may be found in patent application US2015/0077629 A1, titled "Camera module." More information about a proximity sensor may be found in U.S. Pat. No. 8,996,082 B2, titled "Proximity sensor arrangement having a cold mirror in a mobile device."

Figure 4:
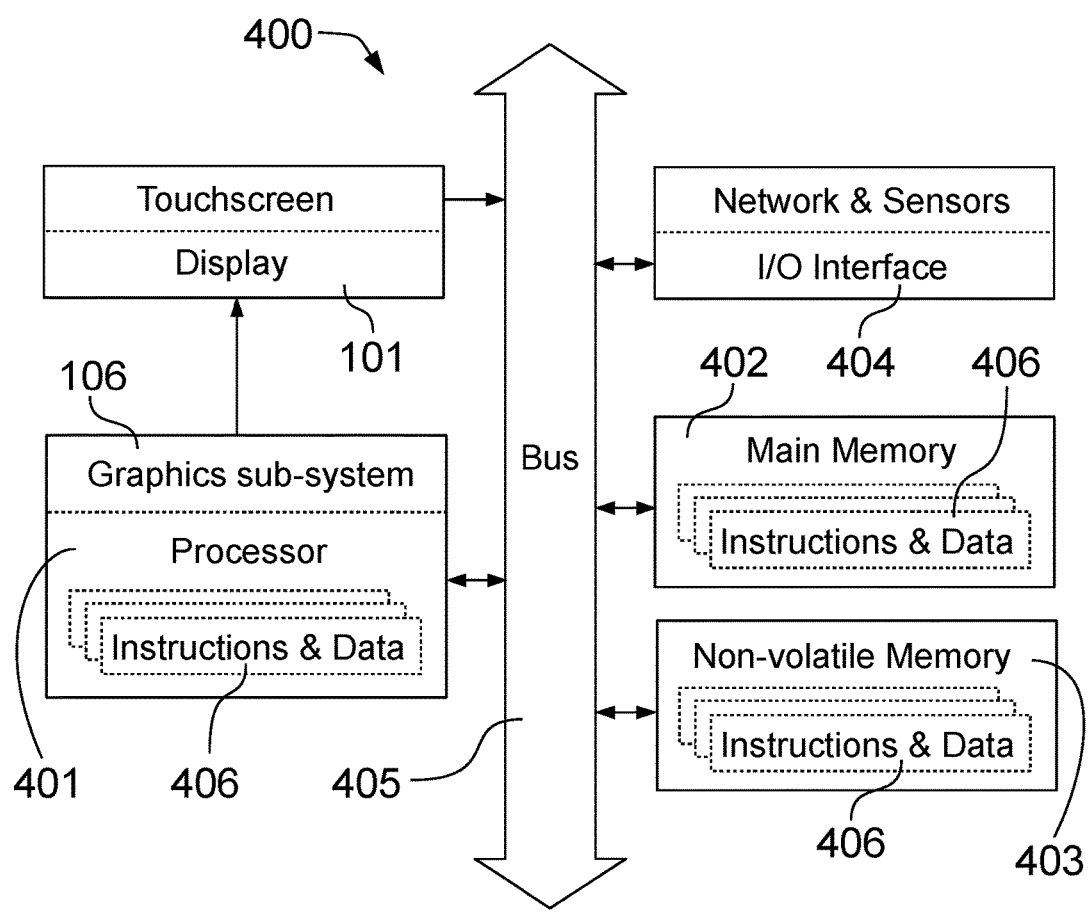
FIG. 4 is a diagrammatic representation of the computer system of a smartphone (prior art).

FIG. 4 (labeled "prior art") is a diagrammatic representation of the computer system 400 of the smartphone 100. The computer system 400, as known from the prior art, may consist of a processor 401 (CPU), a main memory 402 (RAM), at least one non-volatile memory 403 (e.g., flash memory, SSD, or memory card), an I/O interface 404, including network interface and sensors (e.g., WiFi®, mobile communications, and accelerometer), and other familiar devices. The components of the computer system 400 can be coupled together via a bus system 405 or through some other known or convenient devices.

Instructions 406 for the execution on the processor 401 and data (e.g., text data, vector data, and bitmap image data) may be stored in the main memory 402 and/or the non-volatile memory 403. For example, the processor 401 may execute instructions 406 (stored in main memory 402 and/or non-volatile memory 403) to process bitmap image data (also stored in main memory 402 and/or non-volatile memory 403) that is displayed on the display screen 101 via the graphics sub-system 106.

The common computer system 400, as per FIG. 4, is intended to illustrate a hardware platform on which any of the subsequent embodiments (and any other components described in this specification) can be implemented. It is to be expressly noted that the computer system 400 integrated into the mobile electronic device (e.g., smartphone 100) can be of any applicable known or convenient type.

Figure 5:
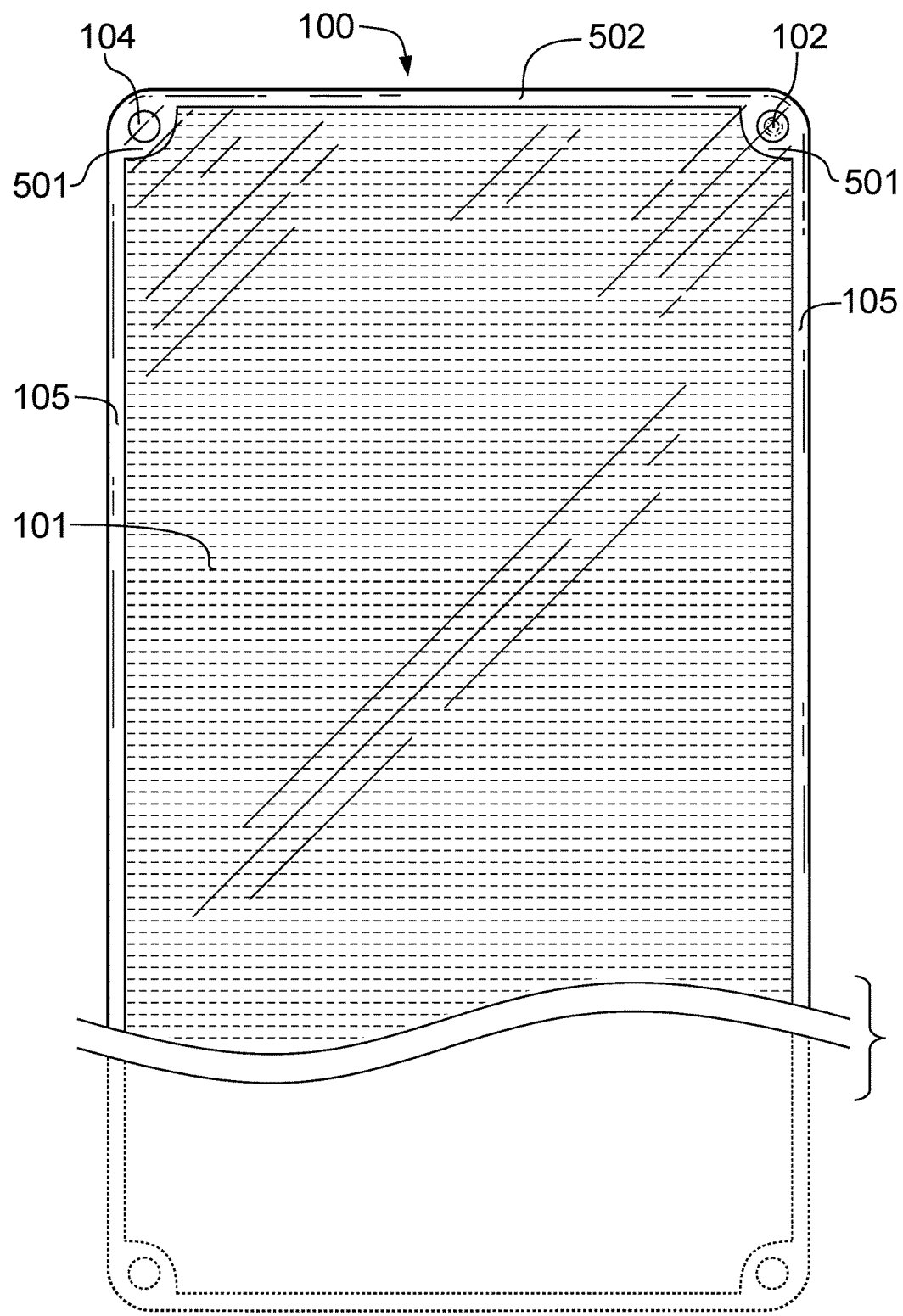
FIG. 5 is a top plan view of an embodiment of the mobile electronic device in accordance with the present invention. The housing of the mobile electronic device is characterized by a very thin border or edging at least at the upper edge, left edge, and right edge of the display screen. The lens of a front camera module, optical sensor, and/or optical emitter is located at least in the upper right-hand corner, as shown in the drawing. Both, the display screen and the lens in the upper right-hand corner are covered by a transparent or semi-transparent material, such as glass. For illustrative purposes, the display screen shows a gray color by means of standard drafting symbol patterns. This color (e.g., dark gray) could represent the display screen in the switched-off state.

Turning now to the embodiments of the present invention, FIG. 5 shows the front side of an exemplary smartphone 100 (or phablet) with a display screen 101 and at least one front camera (lens 102), optical sensor 104, and/or optical emitter 104. The smartphone 100 and the display screen 101 can have a different (e.g., larger) aspect ratio, as indicated by curved break lines and associated curly brackets in the drawings.

In the example, as per FIG. 5, the housing of the smartphone 100 is characterized by a very thin border 502, 105 at the upper edge, lower edge, left edge, and right edge of the display screen 101. In particular, the border 502 at the top of display screen 101 may be very thin. The benefits are, inter alia, a bigger screen and/or smaller phone dimensions. In order to accommodate the lens 102 of a front camera module, optical sensor 104, and/or optical emitter 104 at the top of the display screen 101—in spite of the very thin border 502—the upper left-hand and right-hand corners of the display screen 101 are cut out. This is illustrated in FIG. 5: A recess or cutout 501 at the top left-hand corner and a recess or cutout 501 at the top right-hand corner have been removed from the display panel. For illustrative purposes, the display screen 101, as shown in FIG. 5, is emphasized by means of standard drafting symbol patterns. The color "dark gray" of the display screen 101 could represent the display panel in the switched-off state.

As shown in FIG. 5, at least one lens 102 of a front camera module, optical sensor, and/or optical emitter may be located at least in the upper right-hand corner of the housing of the smartphone 100, at the location of the cutout 501. Both the display 101 and the lens 102 in the upper right-hand corner may be covered by a transparent (or semi-transparent) material, such as glass, as illustrated in the drawings by means of shading lines slanted at an angle of 45 degrees.

Depending on the embodiment, one or more cutouts 501 of the display screen 101 may have mainly a convex shape (as opposed to a conventional display screen with rounded corners, which has concave cutouts). As can be seen in FIG. 5, a cutout 501 that is mainly convex may be advantageous because it maximizes the remaining area of the display screen 101, while still accommodating the lens 102 of the front-facing camera (or other optical sensors/emitters 104).

Figure 6:
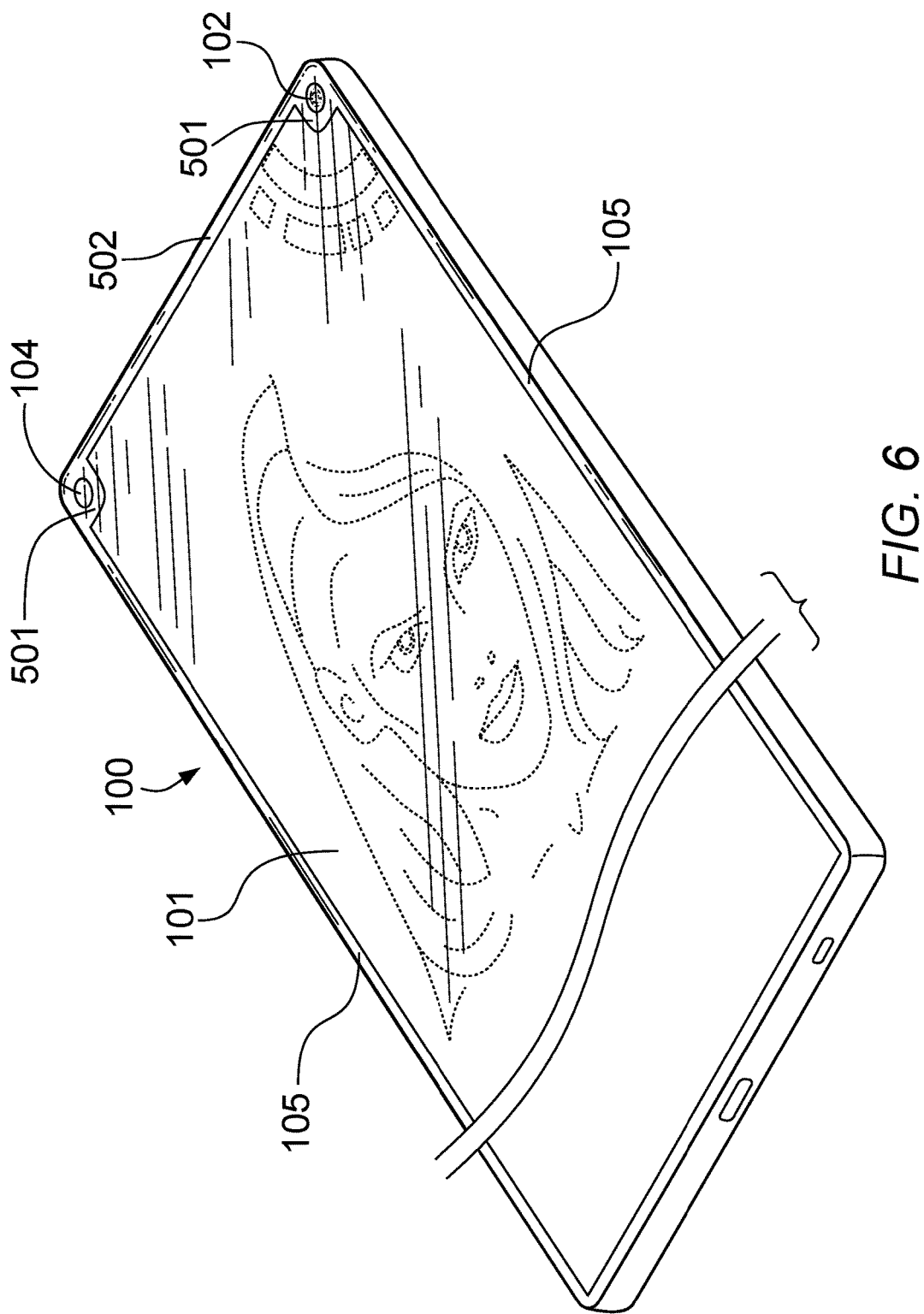
FIG. 6 is a top/front perspective view of an embodiment of the mobile electronic device in accordance with the present invention. For illustrative purposes, the display screen shows the self-portrait of a woman that may have been taken by the front camera.
Figures 7, 8, 9:
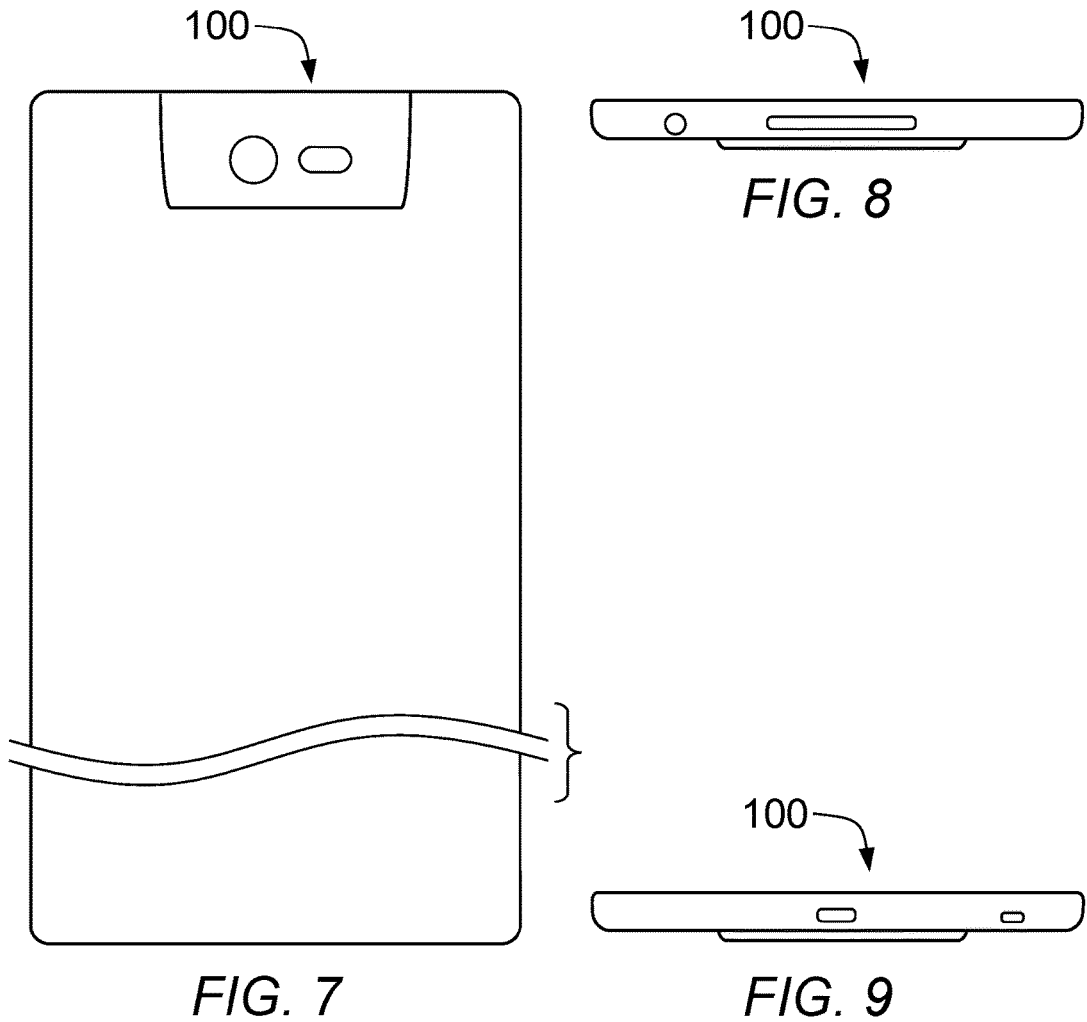
FIG. 7 is a bottom view thereof.
FIG. 8 is a rear view thereof.
FIG. 9 is a front view thereof.

FIG. 6 shows a perspective view of an embodiment of the smartphone 100 featuring very thin borders 502, 105 (at least at the upper edge, left edge, and right edge of the display screen 101) and cutouts 501 at the top left and right corners of the display screen 101. The lens 102 of a front camera module and/or other optical sensors/emitters 104 may be disposed at the locations of the cutouts 501. For illustrative purposes, the display screen 101 displays the self-portrait of a woman that may have been taken by the front camera via the lens 102. FIG. 7 shows the rear side of the smartphone 100, and FIG. 8, FIG. 9, and FIG. 10 show side views of the smartphone 100, as an example.

Figure 11:
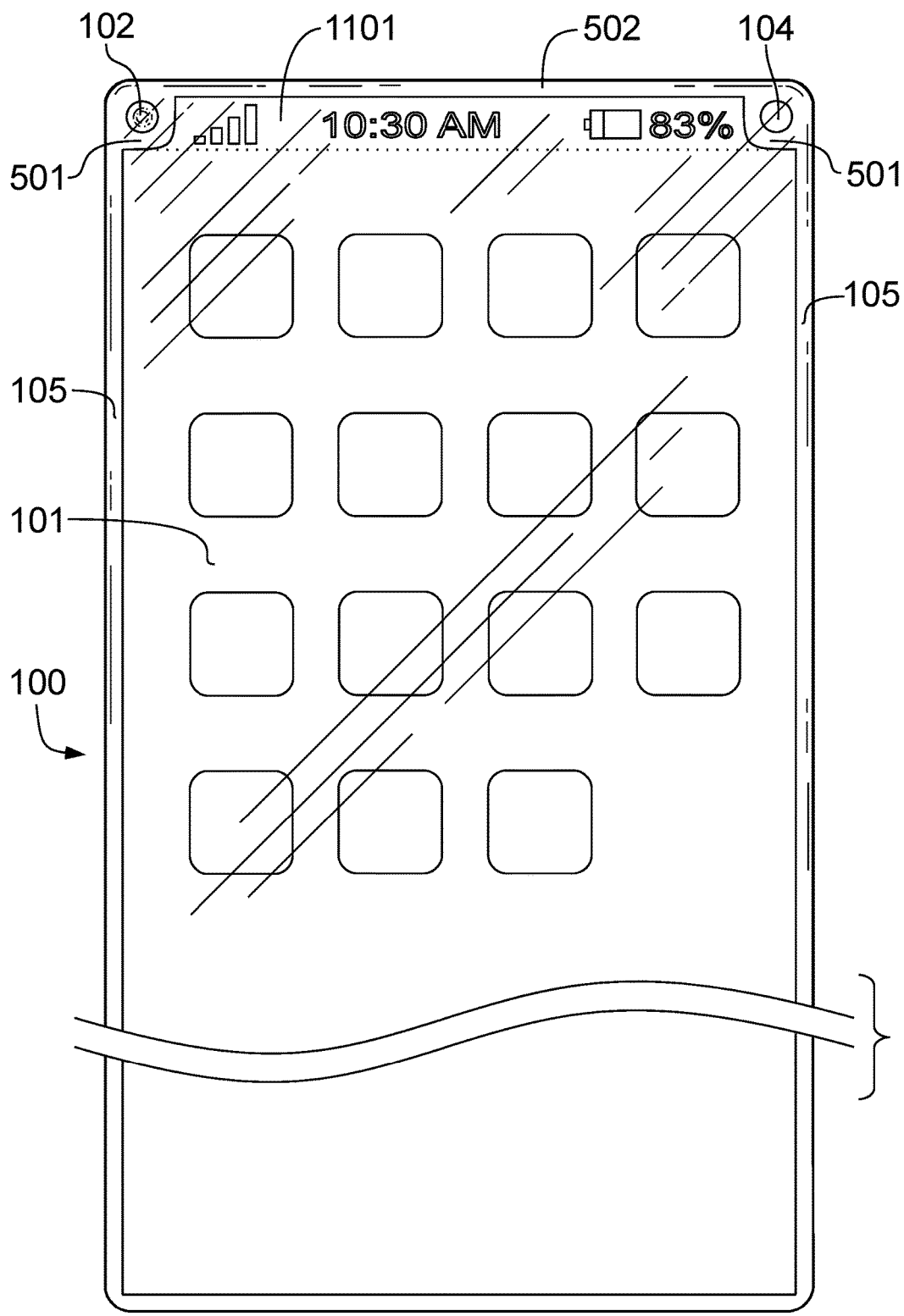
FIG. 11 is a top plan view of an embodiment of the mobile electronic device in accordance with the present invention.

Turning now to FIG. 11, the front side of an exemplary smartphone 100 with thin borders 502, 105 is shown, wherein the lens 102 (e.g., of a front camera module) is located in the upper left-hand corner at a first cutout 501 of the display screen 101. A second cutout 501 (that may accommodate optical sensors 104 and/or optical emitters 104) is located in the upper right-hand corner of the display screen 101. As specifically shown in FIG. 11, the display screen 101 displays an uninterrupted status bar 1101 that extends—without interruptions—from the first cutout 501 (in the upper left-hand corner) to the second cutout 501 (in the upper right-hand corner).

As can be seen in FIG. 11, the upper status bar 1101 between the two cutouts 501 may contain information such as the signal strength (icon for signal strength: "four bars" in the present example), the time of day ("10:30 AM" in the present example), and the battery level (icon for the battery: "83%" in the present example). It can also be seen that the upper status bar 1101 is not interrupted by a notch in the middle of the upper edge of the display screen 101, i.e., if desired, information such as the time of day ("10:30 AM" in the example) may be positioned in the middle of the status bar 1101 without being hidden by a notch. The status bar 1101 may display any suitable information and the icons may be arranged in any suitable order.

As is conventional for a smartphone 100, the screen content displayed on the display screen 101 may change, i.e., may switch to a different screen content. The example, as per FIG. 12, shows a display screen 101 (with two cutouts 501) that displays a letterboxed wide-screen movie frame 1201 (e.g., black bars 1202 above and below the movie 1201). As can be seen in the drawing, the wide-screen movie 1201 is displayed as a full screen in the landscape mode, i.e., the user may hold the smartphone 100 horizontally.

The wide-screen movie 1201 may have an aspect ratio that is wider, i.e., greater, than the aspect ratio of the display screen 101. Therefore, the wide-screen movie 1201 may be displayed in "letterbox" mode, such that the two cutouts 501 of the display screen 101 are mostly located in the region of the horizontal bars 1202 above and below the wide-screen movie 1201, thereby reducing or preventing the problem that parts of the movie 1201 are invisible (i.e., hidden) due to the cutouts 501. Depending on the aspect ratio, the wide-screen movie 1201 may be completely visible—no corners of the movie 1201 may be hidden by the cutouts 501.

As specifically shown in FIG. 12, the wide-screen movie frame 1201 uses the full width of the display screen 101 (in landscape orientation) and there is no notch in the middle of the left edge of the display screen 101 that would hide a part of the movie 1201 on the left. Moreover, the embodiment, as per FIG. 12, is able to display the movie 1201 in a larger manner than a conventional smartphone (with the same dimensions of the casing).

The cutout(s) 501, the lens 102, and/or the optical sensor(s)/emitter(s) 104 may be located at any corner(s) of the display screen 101, for example, at all four corners of the display screen 101 (as shown in FIG. 13 and FIG. 14), in two corners (as shown in FIG. 11 and FIG. 12), or in one corner only.

FIG. 13 shows the front side of an embodiment of a smartphone 100 that features thin borders 502 at the upper and lower edge, thin borders 105 at the left and right edge, and cutouts 501 at all four corners of the display screen 101. The lens 102 of a front camera module and/or other optical sensors/emitters 104 may be disposed at the locations of all four cutouts 501. The display screen 101 displays a status bar 1101 between the two upper cutouts 501. Furthermore, the display screen 101 shows schematized app icons of a start screen (illustrated in dotted lines).

A letterboxed wide-screen movie 1201 may also be displayed by a display screen 101 having cutouts 501 at all four corners—without hiding significant parts of the movie 1201. As can be seen in FIG. 14, a wide-screen movie frame 1201 (illustrated in dotted lines) is displayed in landscape mode using the full width of the display screen 101 both at the left and right side (horizontal orientation). All four cutouts 501 may be located in the region of the horizontal bars 1202 above and below the wide-screen movie 1201 either entirely or for the most part—depending on the aspect ratio of the wide-screen movie 1201. The thin borders 502 at the left and right side of the smartphone's casing 100 (orientated horizontally) maximize the size of the movie 1201.

FIG. 15 shows the front side of a further embodiment of the smartphone 100 featuring thin borders 105, 502 at all edges and cutouts 501 (for optical sensors/emitters 102, 104) at all four corners of the display screen 101. In this example, the display screen 101 displays a status bar 1101 at the top, onscreen soft keys 1501 for the navigation at the bottom, and the chat dialog of a communication app.

As is specifically shown in FIG. 15, the horizontal navigation bar 1501 extends—without interruptions—from a first cutout 501 in the lower left-hand corner to a second cutout 501 in the lower right-hand corner and comprises onscreen soft keys, such as "Back" (arrow icon), "Home" (house icon), or "Menu" (menu icon).

In embodiments of the present invention, the cutouts 501 of the display screen 101 and the corners of the smartphone's housing 100 may have any suitable shape. FIG. 16 through FIG. 21 illustrate various exemplary shapes of cutouts 501, including, but not limited to, a rectangle with rounded corners (see enlarged view 1600 and 1700), a curved shape, (see enlarged view 1800 and 1900), or a rectangle with sharp corners (see enlarged view 2000 and 2100). For illustrative purposes, the display screen 101, as shown in the enlarged views, is emphasized by means of standard drafting symbol patterns (color "dark gray").

Furthermore, in embodiments of the present invention, the status bar 1101 between the two upper cutouts 501 and the navigation bar 1501 between the two lower cutouts 501 may have any suitable height. This is illustrated in the non-limiting example, as per FIG. 22. As can be seen by means of the dot-dash auxiliary lines, the height of the icons of the status bar 1101 may be smaller than the height of the cutout(s) 501, and the height of the icons of the navigation bar 1501 may be greater than the height of the cutout(s) 501.

Turing now to FIG. 23, the display screen 101 of an exemplary smartphone 100 displays the self-portrait of a woman that may have been taken by the front camera. Furthermore, the display screen 101 displays a schematized camera lens symbol 2301, which may be animated and which may indicate an active front camera. In other words, when taking a self-portrait photograph ("selfie") with the front-facing camera (lens 102), the status of the front camera may be indicated on the display screen 101 by means of a quarter circle 2301 or one or more circular sections 2301 that surround the lens 102—as shown in FIG. 23. The quarter circle or circular sections 2301 may be animated and may indicate operating states of the front camera, such as "active."

With reference to FIG. 12, FIG. 14, and FIG. 23, it should be noted that the status bar 1101 may not be displayed on the display screen 101 (i.e., hidden or faded out) in these cases, in order to improve the visual representation of the displayed screen content, such as a maximized screen width for the wide-screen movie 1201 (in FIG. 12 and FIG. 14) or to display a quarter circle 2301 that surrounds the lens 102 (in FIG. 23).

Instead of a flat display screen 101, as shown in FIG. 6, FIG. 10, and FIG. 23, all embodiments may be designed with a slightly curved display screen 101, i.e., a display having a curved surface. Such an embodiment is shown in FIG. 24 through FIG. 27 for the purpose of example only, wherein FIG. 24 shows the rear side of the smartphone 100 and FIG. 25, FIG. 26, and FIG. 27 show side views of the smartphone 100. The curved display screen 101 is visible in FIG. 27. Furthermore, FIG. 24 shows a rear side of the smartphone 100 that is characterized by a fully symmetrical arrangement. For example, a rear camera may be located both at the top and at the bottom of the rear side.

In the claims, the term "horizontal matte region" is used for the horizontal bar(s) 1202 above and/or below the wide-screen movie 1201. The borders 105, 502 (or "thin borders," as used in the claims) that surround the display screen 101 shall be defined as the distance between the outer housing frame of the smartphone 100 and the beginning of the active screen area (which displays the screen content). Furthermore, the term "screen content" (or "first screen content," "second screen content," etc., as used in the claims) shall be interpreted as the entire, all-encompassing content displayed on the display screen 101.

The conjunction "or," as used in the claims, shall be interpreted as an alternative between two (or more) features, such as alternative embodiments, and shall not be construed to specifically exclude any "non-selected" feature (such as an "XOR" operator). A list of features connected with an "or" that starts with the phrase "at least" or that ends with the phrase "a combination thereof" covers both single features from the list as well as any groups of features thereof. Furthermore, the conjunction "or," as used in the claims, shall not be construed as a logical "OR" operator of a computer program: even if a claim contains a condition, the conjunction "or" is intended to specify alternative features of the claim, such as alternative method steps.

Although the description above contains many specificities, these should not be construed as limiting the scope of the embodiments but as merely providing illustrations of some of several embodiments. Thus, the scope of the embodiments should be determined by the appended claims and their legal equivalents, rather than by the examples given.

What is claimed is:

1. A method for maximizing the size of a wide-screen movie in relation to the outer dimensions of a smartphone equipped with a front camera, comprising:
  a) providing an oblong display, said display being aligned in landscape orientation and having a left edge, a right edge, an upper edge, a lower edge, a horizontal screen width, an upper-left corner, and a lower-left corner, wherein said display has an upper-left cutout at said upper-left corner and a lower-left cutout at said lower-left corner, said upper-left cutout having an upper-left cutout area, and said lower-left cutout having a lower-left cutout area, b) providing at least one front camera and at least one optical emitter, c) providing an oblong casing with at least a first thin border and a second thin border, said casing being aligned in landscape orientation and having an outer horizontal measurement, d) configuring said smartphone to display a first screen content on said display, comprising:

i) a wide-screen movie in landscape orientation that seamlessly extends over the entire horizontal screen width of said display, said wide-screen movie having a left side, a right side, and an image width, wherein the left side of said wide-screen movie is displayed between said upper-left cutout and said lower-left cutout, ii) an upper horizontal matte region located above said wide-screen movie, wherein said upper horizontal matte region extends into said upper-left cutout area, such that said upper-left cutout is accommodated, at least in part, in said upper horizontal matte region, iii) a lower horizontal matte region located below said wide-screen movie, wherein said lower horizontal matte region extends into said lower-left cutout area, such that said lower-left cutout is accommodated, at least in part, in said lower horizontal matte region, e) disposing said at least one front camera, at least in part, in said upper-left cutout area or said lower-left cutout area, and disposing said at least one optical emitter, at least in part, in said lower-left cutout area or said upper-left cutout area, f) disposing said first thin border adjacent to the left side of said wide-screen movie and said second thin border adjacent to the right side of said wide-screen movie, such that the outer horizontal measurement of said casing is nearly equal to the image width of said wide-screen movie, g) configuring said smartphone to alternately display a second screen content on said display, comprising:

i) a photograph having a visible area, wherein said photograph seamlessly extends to the left edge, the right edge, the upper edge, and the lower edge of said display, and ii) a schematized camera lens symbol located adjacent to said upper-left cutout area or said lower-left cutout area, wherein said schematized camera lens symbol surrounds said upper-left cutout area or said lower-left cutout area substantially in a quarter circle, such that the visible area of said photograph is maximized, said schematized camera lens symbol being animated and being visible, at least if said front camera is active.

2. The method of claim 1, wherein said upper horizontal matte region and said lower horizontal matte region are empty and contain no content.

3. The method of claim 2, wherein said upper horizontal matte region and said lower horizontal matte region are displayed in black.

4. The method of claim 1, wherein said display has a curved surface.

5. The method of claim 1, wherein said smartphone is a phablet.

6. A method for increasing the screen area for a wide-screen movie in relation to the outer dimensions of a smartphone equipped with a front camera, comprising:

a) providing an oblong display, said display being aligned in landscape orientation and having a left edge, a right edge, an upper edge, a lower edge, a horizontal screen width, at least an upper corner, and at least a lower corner, wherein said display has an upper cutout at said upper corner and a lower cutout at said lower corner, said upper cutout having an upper cutout area, and said lower cutout having a lower cutout area, b) providing at least one front camera and disposing said front camera, at least in part, in said upper cutout area or said lower cutout area, c) providing an oblong casing with at least a first thin border and a second thin border, said casing being aligned in landscape orientation and having an outer horizontal measurement, d) configuring said smartphone to display a first screen content on said display, comprising:

i) a wide-screen movie in landscape orientation that seamlessly extends over the entire horizontal screen width of said display, said wide-screen movie having a left side, a right side, and an image width, wherein said wide-screen movie is displayed horizontally between said upper cutout and said lower cutout, ii) an upper horizontal matte region located above said wide-screen movie, wherein said upper horizontal matte region extends into said upper cutout area, such that said upper cutout is accommodated, at least in part, in said upper horizontal matte region, iii) a lower horizontal matte region located below said wide-screen movie, wherein said lower horizontal matte region extends into said lower cutout area, such that said lower cutout is accommodated, at least in part, in said lower horizontal matte region, e) disposing said first thin border adjacent to the left side of said wide-screen movie and said second thin border adjacent to the right side of said wide-screen movie, such that the outer horizontal measurement of said casing is nearly equal to the image width of said wide-screen movie, f) configuring said smartphone to alternately display a second screen content on said display, comprising:

i) a photograph having a visible area, wherein said photograph seamlessly extends to the left edge, the right edge, the upper edge, and the lower edge of said display, and ii) a schematized camera lens symbol located adjacent to said upper cutout area or said lower cutout area, wherein said schematized camera lens symbol surrounds said upper cutout area or said lower cutout area substantially in a quarter circle, such that the visible area of said photograph is maximized, said schematized camera lens symbol being animated and being visible, at least if said front camera is active.

7. The method of claim 6, wherein said front camera is a front camera module with at least one lens.

8. The method of claim 6, wherein said upper horizontal matte region and said lower horizontal matte region are empty and contain no content.

9. The method of claim 6, wherein said display has a curved surface.

10. The method of claim 6, wherein said smartphone is a phablet.

11. A smartphone having a front-facing camera, said smartphone being made for maximizing the size of a wide-screen movie in relation to the outer dimensions of said smartphone, comprising:

a) an oblong display, said display being aligned in landscape orientation and having a horizontal screen width, at least an upper corner, and at least a lower corner, wherein said display has an upper cutout at said upper corner and a lower cutout at said lower corner, said upper cutout having an upper cutout area, and said lower cutout having a lower cutout area,
b) a computer system configured to be at least able to alternately display a first screen content and a second screen content on said display,
c) said first screen content comprising:
  i) a wide-screen movie in landscape orientation that seamlessly extends over the entire horizontal screen width of said display, said wide-screen movie having a left side, a right side, and an image width, wherein said wide-screen movie is displayed horizontally between said upper cutout and said lower cutout,
  ii) an upper horizontal matte region located above said wide-screen movie, wherein said upper horizontal matte region extends into said upper cutout area, such that said upper cutout is accommodated, at least in part, in said upper horizontal matte region,
  iii) a lower horizontal matte region located below said wide-screen movie, wherein said lower horizontal matte region extends into said lower cutout area, such that said lower cutout is accommodated, at least in part, in said lower horizontal matte region,
d) at least one front camera module with at least one lens disposed, at least in part, in said upper cutout area or said lower cutout area, and at least one optical emitter disposed, at least in part, in said lower cutout area or said upper cutout area,
e) an oblong casing with at least a first thin border and a second thin border, said casing being aligned in landscape orientation and having an outer horizontal measurement, wherein said first thin border is disposed adjacent to the left side of said wide-screen movie and said second thin border is disposed adjacent to the right side of said wide-screen movie, such that the outer horizontal measurement of said casing is nearly equal to the image width of said wide-screen movie,
f) said second screen content comprising:
  i) an image having a visible area, and
  ii) a schematized camera lens symbol located adjacent to said upper cutout area or said lower cutout area, wherein said schematized camera lens symbol surrounds said upper cutout area or said lower cutout area substantially in a quarter circle, such that the visible area of said image is maximized, said schematized camera lens symbol being animated and being visible, at least if said front camera module is active.

12. The smartphone of claim 11, wherein said upper horizontal matte region and said lower horizontal matte region are empty and contain no content.

13. The smartphone of claim 12, wherein said upper horizontal matte region and said lower horizontal matte region are displayed in black.

14. The smartphone of claim 11, wherein said display has a curved surface.

15. The smartphone of claim 11, wherein said smartphone is a phablet.

16. A smartphone comprising:
a) an oblong display, said display being aligned in landscape orientation and having a horizontal screen width, at least an upper corner, and at least a lower corner, wherein said display has an upper cutout at said upper corner and a lower cutout at said lower corner, said upper cutout having an upper cutout area, and said lower cutout having a lower cutout area,
b) at least one front camera disposed, at least in part, in said upper cutout area or said lower cutout area,
c) a computer system configured to be at least able to alternately display a first screen content and a second screen content on said display,
d) said first screen content comprising:
  i) an image having a visible area, and
  ii) a schematized camera lens symbol located adjacent to said upper cutout area or said lower cutout area, wherein said schematized camera lens symbol surrounds said upper cutout area or said lower cutout area substantially in a quarter circle, such that the visible area of said image is maximized, said schematized camera lens symbol being animated and being visible, at least if said front camera is active,
e) said second screen content comprising:
  i) a wide-screen movie in landscape orientation that seamlessly extends over the entire horizontal screen width of said display, said wide-screen movie having a left side, a right side, and an image width, wherein said wide-screen movie is displayed horizontally between said upper cutout and said lower cutout,
  ii) an upper horizontal matte region located above said wide-screen movie, wherein said upper horizontal matte region extends into said upper cutout area, such that said upper cutout is accommodated, at least in part, in said upper horizontal matte region,
  iii) a lower horizontal matte region located below said wide-screen movie, wherein said lower horizontal matte region extends into said lower cutout area, such that said lower cutout is accommodated, at least in part, in said lower horizontal matte region,
f) an oblong casing with at least a first thin border and a second thin border, said casing being aligned in landscape orientation and having an outer horizontal measurement, wherein said first thin border is disposed adjacent to the left side of said wide-screen movie and said second thin border is disposed adjacent to the right side of said wide-screen movie, such that the outer horizontal measurement of said casing is nearly equal to the image width of said wide-screen movie.

17. The smartphone of claim 16, wherein said front camera is a front camera module with at least one lens.

18. The smartphone of claim 16, wherein said upper horizontal matte region and said lower horizontal matte region are empty and contain no content.

19. The smartphone of claim 16, wherein said display has a curved surface.

20. The smartphone of claim 16, wherein said smartphone is a phablet.

* * * * *